United States Patent
Kikushima (10) Patent No.: US 9,252,350 B2
(45) Date of Patent: Feb. 2, 2016

(54) OSCILLATION PIECE, OSCILLATOR, ELECTRONIC DEVICE, ELECTRONIC APPARATUS, AND MOBILE OBJECT

(71) Applicant: Seiko Epson Corporation, Tokyo (JP)

(72) Inventor: Masayuki Kikushima, Ina (JP)

(73) Assignee: Seiko Epson Corporation (JP)

( * ) Notice: Subject to any disclaimer, the term of this patent is extended or adjusted under 35 U.S.C. 154(b) by 297 days.

(21) Appl. No.: 13/936,570

(22) Filed: Jul. 8, 2013

(65) Prior Publication Data
US 2014/0015381 A1    Jan. 16, 2014

(30) Foreign Application Priority Data

Jul. 10, 2012 (JP) ................... 2012-154354

(51) Int. Cl.
| | |
|---|---|
| *H03H 9/15* | (2006.01) |
| *H03H 9/24* | (2006.01) |
| *H01L 41/04* | (2006.01) |
| *G01L 9/00* | (2006.01) |
| *G01L 1/16* | (2006.01) |

(52) U.S. Cl.
CPC ............... *H01L 41/04* (2013.01); *G01L 1/162* (2013.01); *G01L 9/0022* (2013.01); *H03H 9/2473* (2013.01); *H03H 9/15* (2013.01)

(58) Field of Classification Search
CPC ..... H01L 41/04; H01L 41/053; H01L 41/113; H01L 41/1132; H03H 9/2473
USPC .................... 310/321, 338, 348, 367
See application file for complete search history.

(56) References Cited

U.S. PATENT DOCUMENTS

| | | | |
|---|---|---|---|
| 4,773,493 A | | 9/1988 | Goodier |
| 5,020,370 A | * | 6/1991 | Deval et al. ............... 73/514.29 |

FOREIGN PATENT DOCUMENTS

| | | |
|---|---|---|
| JP | 60-039911 | 3/1985 |
| JP | 64-029110 | 1/1989 |
| JP | 2008-306621 | 12/2008 |
| JP | 2010-074246 | 4/2010 |
| JP | 2011-059097 | 3/2011 |

* cited by examiner

*Primary Examiner* — Derek Rosenau
(74) *Attorney, Agent, or Firm* — Harness, Dickey & Pierce, P.L.C.

(57) ABSTRACT

An oscillation piece includes a first oscillation arm and a second oscillation arm, a first base that connects ends of the first oscillation arm and the second oscillation arm on one side to each other and a second base that connects ends of the first oscillation arm and the second oscillation arm on the other side to each other, and weight films provided on each of the first oscillation arm and the second oscillation arm. The drive electrodes are disposed in positions where the amount of distortion produced in the first oscillation arm and the second oscillation arm is maximized, and the weight films are disposed in positions where the amount of distortion produced in the first oscillation arm and the second oscillation arm is minimized. The oscillation frequency of the oscillation piece can be precisely adjusted by removing part of the weight films.

8 Claims, 8 Drawing Sheets

OSCILLATION PIECE, OSCILLATOR, ELECTRONIC DEVICE, ELECTRONIC APPARATUS, AND MOBILE OBJECT

BACKGROUND

1. Technical Field

The present invention relates to an oscillation piece, an oscillator, an electronic device, an electronic apparatus, and a mobile object.

2. Related Art

As electronic apparatuses are miniaturized, oscillators used in the electronic apparatus need to be also miniaturized. To achieve the miniaturization with high precision maintained, a double-ended tuning fork oscillation piece is used as an oscillation piece that is a main element of the oscillator. There is a known double-ended tuning fork oscillation piece having two oscillation arms, connection portions that connect ends of the oscillation arms on one side and ends thereof on the other side, and bases that fix the double-ended tuning fork oscillation piece and so configured that the cross-section area of a portion between each of the connection portions and the corresponding base is reduced to suppress what is called oscillation leakage, which causes oscillation of the oscillation arms to be transmitted to the bases, which are fixing portions of the double-ended tuning fork oscillation piece. The thus configured double-ended tuning fork oscillation piece can be miniaturized with the precision thereof maintained (see JP-A-64-29110, for example).

In JP-A-64-29110, the precision of the oscillation piece is improved by preventing the oscillation of the oscillation arms from being transmitted to the bases. To precisely control the frequency of the oscillation piece, the oscillation piece needs to be precisely shaped. An etching process and a photolithography process are typically used as a method for forming such an oscillation piece, but processing precision in these processes is limited and the variation in the shape cannot provide target frequency precision.

SUMMARY

An advantage of some aspects of the invention is to solve at least a part of the problems described above, and the invention can be implemented in the form of the following forms or application examples.

Application Example 1

An oscillation piece according to this application example includes a first oscillation arm and a second oscillation arm each of which has a drive electrode, a first base that connects ends of the first oscillation arm and the second oscillation arm on one side to each other and a second base that connects ends of the first oscillation arm and the second oscillation arm on the other side to each other, and a weight film provided on each of the first oscillation arm and the second oscillation arm.

Such an oscillation piece is also called a double-ended tuning fork oscillation piece because it is formed of two tuning forks, a tuning fork formed of a first oscillation arm and a second oscillation arm connected to each other via a first base and a tuning fork formed of the first oscillation arm and the second oscillation arm connected to each other via a second base.

According to this application example, a weight film is formed on each of the first oscillation arm and the second oscillation arm, and the oscillation frequency of the oscillation piece can be adjusted by removing part of the weight films, whereby variation in the frequency due to variation in the shape of the oscillation piece can be precisely adjusted.

Application Example 2

In the oscillation piece according to the application example described above, it is preferable that each of the weight films is formed of a metal film, and that the drive electrodes and the weight films do not overlap, and are located in positions independent of each other.

The configuration described above prevents short circuits from being produced between the weight films and the drive electrodes without formation of insulating films between the drive electrodes and the weight films. When formed of a metal film, for example, having a large specific gravity, each of the weight films has a necessary mass but has a small area, whereby the area of each of the drive electrodes can be increased and hence the excitation efficiency can be increased.

Application Example 3

In the oscillation piece according to the application example described above, it is preferable that the drive electrodes are disposed in positions where the amount of distortion produced in the first oscillation arm and the second oscillation arm is maximized.

When the oscillation piece is made of a piezoelectric material and current flows through the drive electrodes, charge moves to produce distortion and the first oscillation arm and the second oscillation arm expand or contract. In view of the fact described above, the excitation efficiency can be increased by disposing the drive electrodes in positions where the amount of distortion is maximized. Further, since the weight films are disposed in positions where the weight films do not intersect the drive electrodes, the added weight films do not lower the excitation efficiency.

Since the positions where the amount of distortion is maximized are root portions of the first oscillation arm and the second oscillation arm that are close to the first base and the second base, the drive electrodes are disposed at least in the root portions of the first oscillation arm and the second oscillation arm.

Application Example 4

In the oscillation piece according to the application example described above, it is preferable that the weight films are at least disposed in positions where the amount of distortion produced in the first oscillation arm and the second oscillation arm is minimized.

When the weight films are disposed in positions where the amount of distortion is small, that is, in positions where the amount of produced charge is small, as described above, the frequency adjustment can be efficiently made with a decrease in the amount of produced charge due to the added weight films reduced.

Application Example 5

In the oscillation piece according to the application example described above, it is preferable that the weight films are disposed on each of the first oscillation arm and the second oscillation arm in both the following portions: a portion shifted from a central portion in the longitudinal direction toward the first base and a portion shifted from the central portion in the longitudinal direction toward the second base.

Although will be described in detail in embodiments that will be described later, there are positions close to the first base and the second base where the amount of distortion is minimized when the first oscillation arm and the second oscillation arm oscillate. Therefore, when the weight films are disposed in the positions described above, the frequency adjustment can be effectively made with an effect of the added weight films on the amount of produced charge minimized.

Further, in the configuration described above, the drive electrodes can be disposed not only in the root portions of the first oscillation arm and the second oscillation arm but also in central portions in the longitudinal direction thereof, whereby the excitation efficiency can be further increased.

Application Example 6

In the oscillation piece according to the application example described above, it is preferable that the weight films are disposed on each of the first oscillation arm and the second oscillation arm in a central portion in the longitudinal direction thereof.

The central portion of each of the first oscillation arm and the second oscillation arm is a portion where the amount of distortion is small but greater than that in the root portion and hence a location where frequency adjustment is effectively made. Therefore, when the weight films are disposed in the central portions of the first oscillation arm and the second oscillation arm, the frequency adjustment can be effectively made.

Application Example 7

In the oscillation piece according to the application example described above, it is preferable that the weight films are made of the same material as the material of the drive electrodes.

Each of the drive electrodes is in many cases formed, for example, of a Cr foundation layer on which Au is layered in consideration of adherence to and electric characteristics of the oscillation piece. When each of the weight films is formed of a metal film having the same configuration as that of the drive electrodes, the drive electrodes and the weight films can be formed in the same manufacturing step, whereby manufacturing efficiency can be increased and precise frequency adjustment can be made, for example, by using a laser trimming apparatus.

Application Example 8

An oscillator according to this application example includes the oscillation piece according to any of the application examples described above and a package that accommodates the oscillation piece.

According to this application example, an oscillator having the advantageous effects provided by the application examples described above is achieved.

Further, accommodating the oscillation piece in the package prevents outside moisture and dust from entering and allows stable, precise oscillation to be maintained.

Application Example 9

An electronic device according to this application example includes the oscillation piece according to any of the application examples described above and a package that accommodates the oscillation piece.

According to this application example, an electronic device having the advantageous effects provided by the application examples described above is achieved.

Application Example 10

In the electronic device according to the application example described above, it is preferable that the package includes a package base that supports a fixed end of the oscillation piece in such a way that the oscillation piece behaves as a cantilever, a flexible lid that seals an opening of the package base, and a transmission portion that transmits a displacement of the lid to a free end of the oscillation piece.

The frequency of the oscillation piece described above changes when the oscillating oscillation piece is deformed. An electronic device capable of detecting an externally applied physical quantity by transmitting the displacement of the lid that is produced by the physical quantity to the oscillation piece is therefore achieved.

Examples of the physical quantity to be detected may, for example, include pressure, force (load), and acceleration.

Application Example 11

An electronic apparatus according to this application example includes the oscillation piece according to any of the application examples described above.

According to this application example, an electronic apparatus having the advantageous effects provided by any of the application examples described above is achieved.

Application Example 12

A mobile object according to this application example includes the oscillation piece according to any of the application examples described above.

According to this application example, a mobile object having the advantageous effects provided by any of the application examples described above is achieved.

BRIEF DESCRIPTION OF THE DRAWINGS

The invention will be described with reference to the accompanying drawings, wherein like numbers reference like elements.

FIGS. 5A and 5B show an example of an oscillator.

FIGS. 6A to 6C show a pressure detection device.

DESCRIPTION OF EXEMPLARY EMBODIMENTS

Embodiments of the invention will be described below with reference to the drawings.

The drawings that we refer to in the following description are schematic views in which horizontal and vertical scales of each member or portion differ from actual scales in order to show the member or portion in a recognizable size.

A description will first be made of the exterior shape of a basic form of an oscillation piece (with no weight film) and the configuration of electrodes of the oscillation piece.

Figure 1:
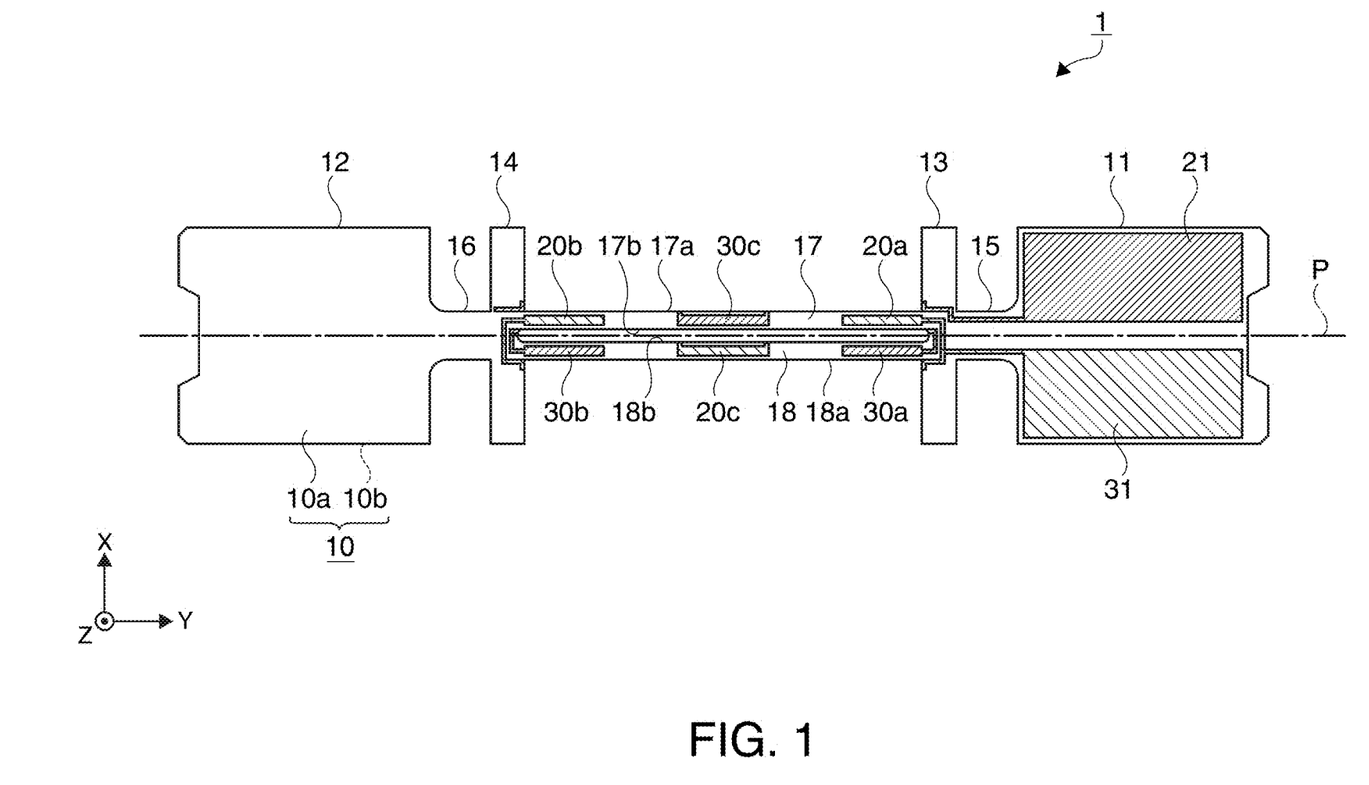
FIG. 1 is a plan view showing an example of the exterior shape of an oscillation piece and the configuration of electrodes of the oscillation piece.

FIG. 1 is a plan view showing an example of the exterior shape of an oscillation piece 1 and the configuration of electrodes of the oscillation piece 1. The oscillation piece 1 includes a first oscillation arm 17 and a second oscillation arm 18, which extend in a Y direction in parallel to each other, a first base 13, which connects ends of the first oscillation arm 17 and the second oscillation arm 18 on one side to each other, a second base 14, which connects ends of the first oscillation arm 17 and the second oscillation arm 18 on the other side to each other, and drive electrodes formed on the first oscillation arm 17 and the second oscillation arm 18, as shown in FIG. 1. The oscillation piece 1 has a first principal surface 10a and a second principal surface 10b, which extend in parallel to a plane including an X axis and a Y axis perpendicular to the X axis and form front and rear surfaces respectively. A Z axis is defined as an axis perpendicular to the first principal surface 10a and the second principal surface 10b. In this embodiment, the oscillation piece 1 is made of quartz, and the X, Y and Z axes are an electrical axis, a mechanical axis, and an optical axis, respectively.

The oscillation piece 1 is precisely formed from a quartz substrate 10, which is cut away from a quartz raw material along a plane inclined by a predetermined angle, by using photolithography, etching, and any other techniques.

The oscillation piece 1 is not necessarily made of quartz but may alternatively be made of lithium tantalate (LiTaO$_3$), lithium tetraborate (Li$_2$B$_4$O$_7$), lithium niobate (LiNbO$_3$), lead zirconate titanate (PZT), zinc oxide (ZnO), aluminum nitride (AlN), or any other piezoelectric material, or silicon or any other semiconductor material on which zinc oxide (ZnO), aluminum nitride (AlN), or any other piezoelectric material is coated.

The oscillation piece 1 further includes a first support 11, which extends from the first base 13 in the +Y direction, and a second support 12, which extends from the second base 14 in the −Y direction. The first base 13 and the first support 11 are connected to each other via a connection portion 15, the width of which is smaller than those of the first base 13 and the first support 11, and the second base 14 and the second support 12 are connected to each other via a connection portion 16, the width of which is smaller than those of the second base 14 and the second support 12.

The configuration of the electrodes of the oscillation piece 1 will next be described. The following drive electrodes are disposed on the first principal surface 10a of the first oscillation arm 17: a drive electrode 20a in a root portion close to the first base 13; a drive electrode 20b in a root portion close to the second base 14; and a drive electrode 30c in a central portion in the longitudinal direction (Y direction), as shown in FIG. 1.

On the other hand, the following drive electrodes are disposed on the first principal surface 10a of the second oscillation arm 18: a drive electrode 30a in a root portion close to the first base 13; a drive electrode 30b in a root portion close to the second base 14; and a drive electrode 20c in a central portion in the longitudinal direction (Y direction).

The drive electrode 20a, the drive electrode 20b, and the drive electrode 20c are not only connected to each other via lead electrodes (not shown) formed on the first principal surface 10a or an outer side surface 17a and an inner side surface 17b of the first oscillation arm 17 and an outer side surface 18a and an inner side surface 18b of the second oscillation arm 18 but also connected to a connection electrode 31 provided on the first principal surface 10a of the first support 11.

The drive electrode 30a, the drive electrode 30b, and the drive electrode 30c are not only connected to each other via lead electrodes (not shown) formed on the first principal surface 10a or the outer side surface 17a and the inner side surface 17b of the first oscillation arm 17 and the outer side surface 18a and the inner side surface 18b of the second oscillation arm 18 but also connected to a connection electrode 21 provided on the first principal surface 10a of the first support 11.

According to the configuration described above, when a drive signal is inputted to the drive electrodes, the drive electrode 20a, the drive electrode 20b, the drive electrode 20c, and the connection electrode 31 have the same potential, and the drive electrode 30a, the drive electrode 30b, the drive electrode 30c, and the connection electrode 21 have the same potential.

Each of the drive electrodes 20a, 20b, 20c, 30a, 30b, and 30c and the connection electrodes 21 and 31 is a metal film formed of a Cr foundation layer on which Au is layered.

The exterior shape of the oscillation piece 1 is symmetrical with respect to an axis P, and the sets of the drive electrode 20a and the drive electrode 30a, the drive electrode 20b and the drive electrode 30b, and the drive electrode 20c and the drive electrode 30c are each disposed substantially symmetrical with respect to the axis P.

The connection electrodes 21 and 31 are connected to a drive circuit (not shown). When an excitation signal is inputted through the connection electrodes 21 and 31, the first oscillation arm 17 and the second oscillation arm 18 make bending oscillation in the ±X direction. The drive electrodes 20a, 20b, and 20c and the drive electrodes 30a, 30b, and 30c also function as detection electrodes.

An oscillation mode of the oscillation piece 1 will subsequently be described.

Figure 2:
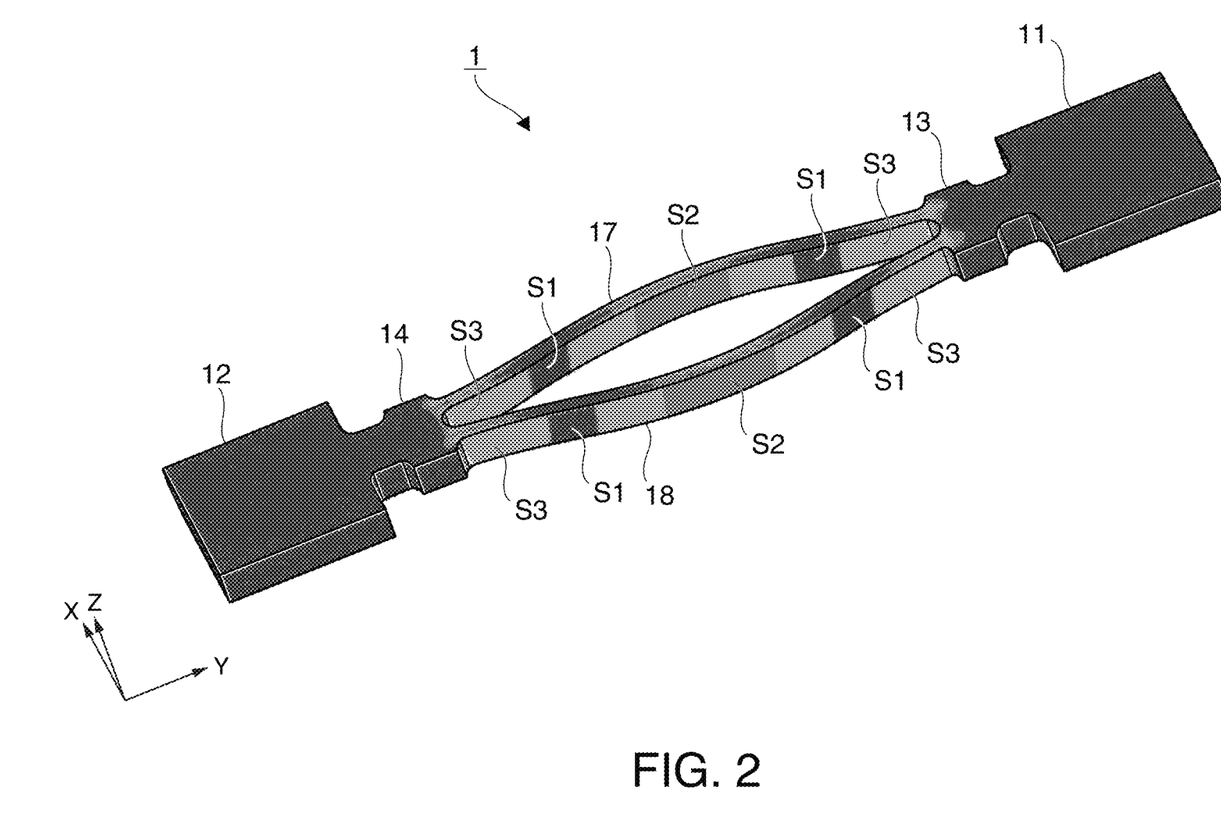
FIG. 2 is a perspective view showing a state in which the oscillation piece oscillates.

FIG. 2 is a perspective view showing a state in which the oscillation piece 1 oscillates, and the oscillation is expressed in the form of relative distortion of the first oscillation arm 17 and the second oscillation arm 18 simulated based on an FEM (finite element method). In FIG. 2, a darker portion represents a smaller distortion region, and the amount of distortion is nearly "0" in the first support 11 and the second support 12. Each S1 region represents a small distortion region within the range of the first oscillation arm 17 and the second oscillation arm 18. Each S2 region also represents a small distortion region where the amount of distortion is small but greater than that in the S1 regions. Each S3 region represents a largest distortion region within the range of the first oscillation arm 17 and the second oscillation arm 18.

A region where the amount of produced distortion is large and hence the amount of produced charge is large is a portion where a drive electrode is suitably disposed, whereas a region where the amount of produced distortion is small and hence the amount of produced charge is small is not a portion where a drive electrode is suitably disposed. That is, a small distortion region is a portion where a weight film, which will be described later, is suitably disposed because the disposed weight film is unlikely to affect the amount of produced charge.

Based on the configuration described above, specific embodiments of the arrangement of the drive electrodes and the weight films will be illustrated and described.

First Embodiment

Figure 3:
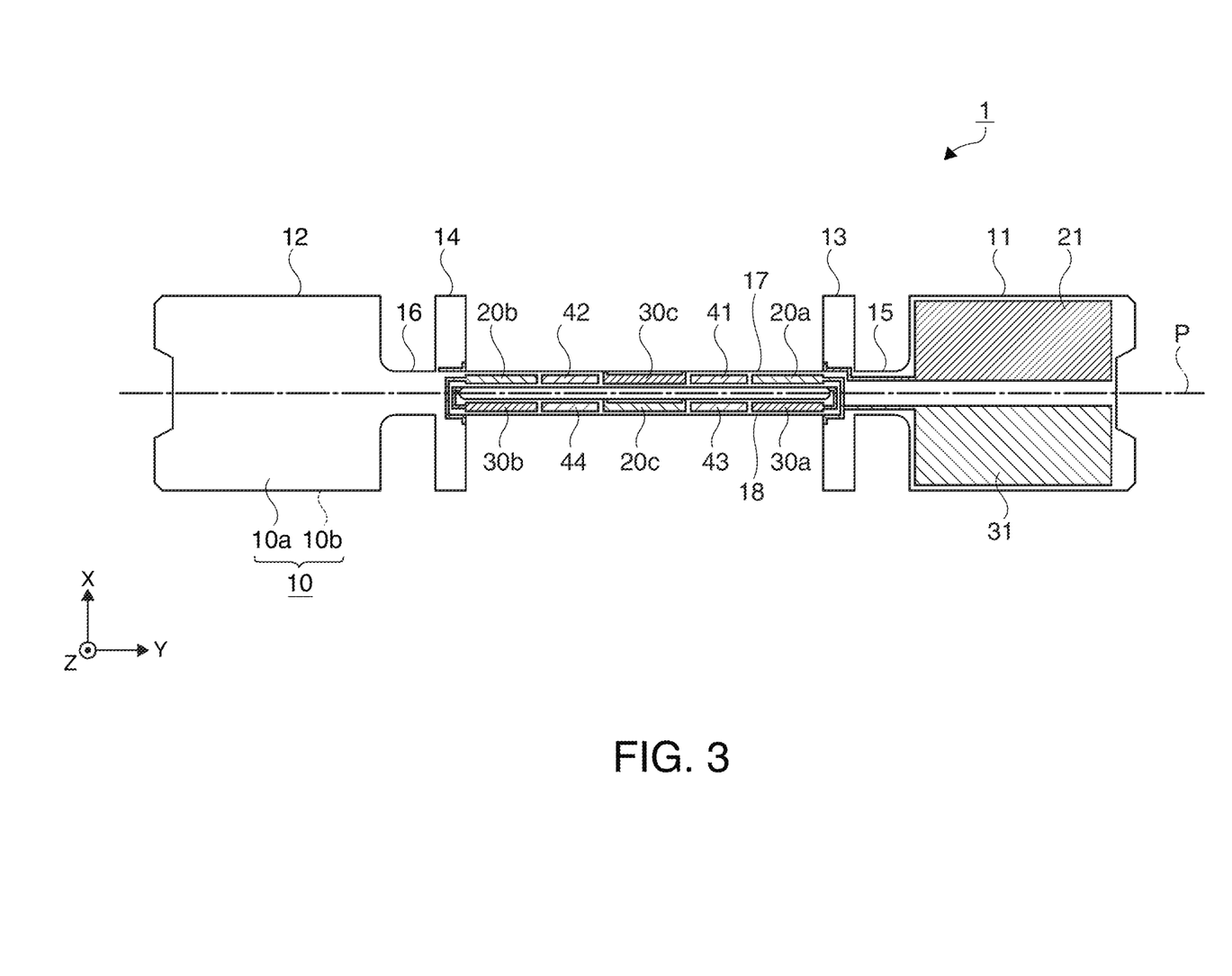
FIG. 3 is a plan view showing an oscillation piece according to a first embodiment.

FIG. 3 is a plan view showing an oscillation piece 1 according to a first embodiment. The exterior shape of the oscillation piece 1 is the same as the basic shape described above (see FIG. 1) and will not therefore be described. The portions common to the basic shape (see FIG. 1) have the same reference characters in the following description. The description will be made with also reference to FIG. 2. The drive electrodes 20a and 30a are disposed on the first oscillation arm 17 and the second oscillation arm 18, respectively, in positions close to the first base 13 (root portions of first and second oscillation arms), and the drive electrodes 20b and 30b are disposed on the first oscillation arm 17 and the second oscillation arm 18, respectively, in positions close to the second base 14 (root portions of first and second oscillation arms). That is, the drive electrodes 20a, 20b, 30a, and 30b are disposed in the S3 regions, where the amount of produced distortion is maximized. On the other hand, the drive electrodes 20c and 30c are disposed on the first oscillation arm 17 and the second oscillation arm 18, respectively, in central portions thereof where an intermediate amount of distortion is produced (S2 regions).

The connection between the drive electrodes 20a, 20b, 20c and the connection electrode 31 and the connection between the drive electrodes 30a, 30b, 30c and the connection electrode 21 are made in the same manner as in FIG. 1 and will not therefore be described.

The oscillation piece 1 according to the present embodiment is further provided with weight films. A weight film 41 is disposed on the first oscillation arm 17 in a position between the drive electrode 20a and the drive electrode 30c, and a weight film 42 is disposed on the first oscillation arm 17 in a position between the drive electrode 30c and the drive electrode 20b, as shown in FIG. 3. On the other hand, a weight film 43 is disposed on the second oscillation arm 18 in a position between the drive electrode 30a and the drive electrode 20c, and a weight film 44 is disposed on the second oscillation arm 18 in a position between the drive electrode 20c and the drive electrode 30b. That is, the weight films 41, 42, 43, and 44 are disposed in regions shown in FIG. 2 where the amount of distortion produced in the first oscillation arm 17 and the second oscillation arm 18 is minimized (S1 regions).

The weight film 41 and the weight film 43 are disposed symmetrically with respect to the axis P, and so are the weight film 42 and the weight film 44.

Each of the weight films 41 to 44 is formed of a metal film. In the present embodiment, the metal film is formed of a Cr foundation layer on which Au is layered, as each of the drive electrodes described above is. The material of the weight films 41 to 44 is, however, not limited to Au—Cr.

Further, the weight films 41 to 44 overlap with none of the drive electrodes 20a, 20b, 20c, 30a, 30b, and 30c, but they are disposed independently of each other and separate from the drive electrodes. That is, the weight films 41 to 44 are electrically isolated from the drive electrodes.

In the oscillation piece 1 according to the first embodiment described above, in which the weight films 41 and 42 are formed on the first oscillation arm 17 and the weight films 43 and 44 are formed on the second oscillation arm 18, the oscillation frequency of the oscillation piece 1 can be adjusted by removing part of the weight films 41, 42, 43, and 44, whereby variation in the frequency due to variation in the shape of the oscillation piece can be precisely adjusted.

When the oscillation piece is made of quartz or any other piezoelectric material, disposing the drive electrodes at locations where the amount of produced charge is large allows increase in excitation efficiency. That is, the amount of produced charge increases in a portion where the amount of produced distortion is maximized. In view of the fact described above, in the present embodiment, the drive electrodes 20a, 20b, 30a, and 30b are disposed on the first oscillation arm 17 and the second oscillation arm 18 in root portions close to the first base 13 and the second base 14 (S3 regions: regions where the amount of distortion is maximized), and the drive electrodes 20c and 30c are further disposed in central portions of the first oscillation arm 17 and the second oscillation arm 18 (S2 regions), whereby the excitation efficiency can be increased.

Further, since the weight films 41, 42, 43, and 44 are disposed in portions where the amount of distortion produced in the first oscillation arm 17 and the second oscillation arm 18 is minimized (S1 regions: regions where charge is not unlikely to be produced), the frequency adjustment can be made with a decrease in the amount of produced charge due to the added weight films 41, 42, 43, and 44 reduced.

Moreover, when formed of a metal film made, for example, of Au—Cr, which has a large specific gravity, each of the weight films 41, 42, 43, and 44 has a necessary mass but has a small area, whereby the area of each of the drive electrodes 20a, 20b, 20c, 30a, 30b, and 30c can be increased and hence the excitation efficiency can be increased.

Further, the weight films 41, 42, 43, and 44 and the drive electrodes 20a, 20b, 20c, 30a, 30b, and 30c are so disposed that they do not overlap with each other but are independent of each other. That is, the weight films 41, 42, 43, and 44 are electrically isolated from the drive electrodes. No short circuit between the weight films 41, 42, 43, and 44 and the drive electrodes 20a, 20b, 20c, 30a, 30b, and 30c will therefore be produced without use of insulating films.

The material of the drive electrodes 20a, 20b, 20c, 30a, 30b, and 30c is Cr as a foundation layer and Au layered on the Cr foundation layer in consideration of adherence to and electric characteristics of quartz of which the oscillation piece 1 is made. When each of the weight films 41, 42, 43, and 44 is formed of a metal film having the same configuration as that of the drive electrodes, the drive electrodes 20a, 20b, 20c, 30a, 30b, and 30c and the weight films 41, 42, 43, and 44 can be formed in the same manufacturing step, whereby manufacturing efficiency can be increased and precise frequency adjustment can be made by using a laser trimming apparatus.

Second Embodiment

Figure 4:
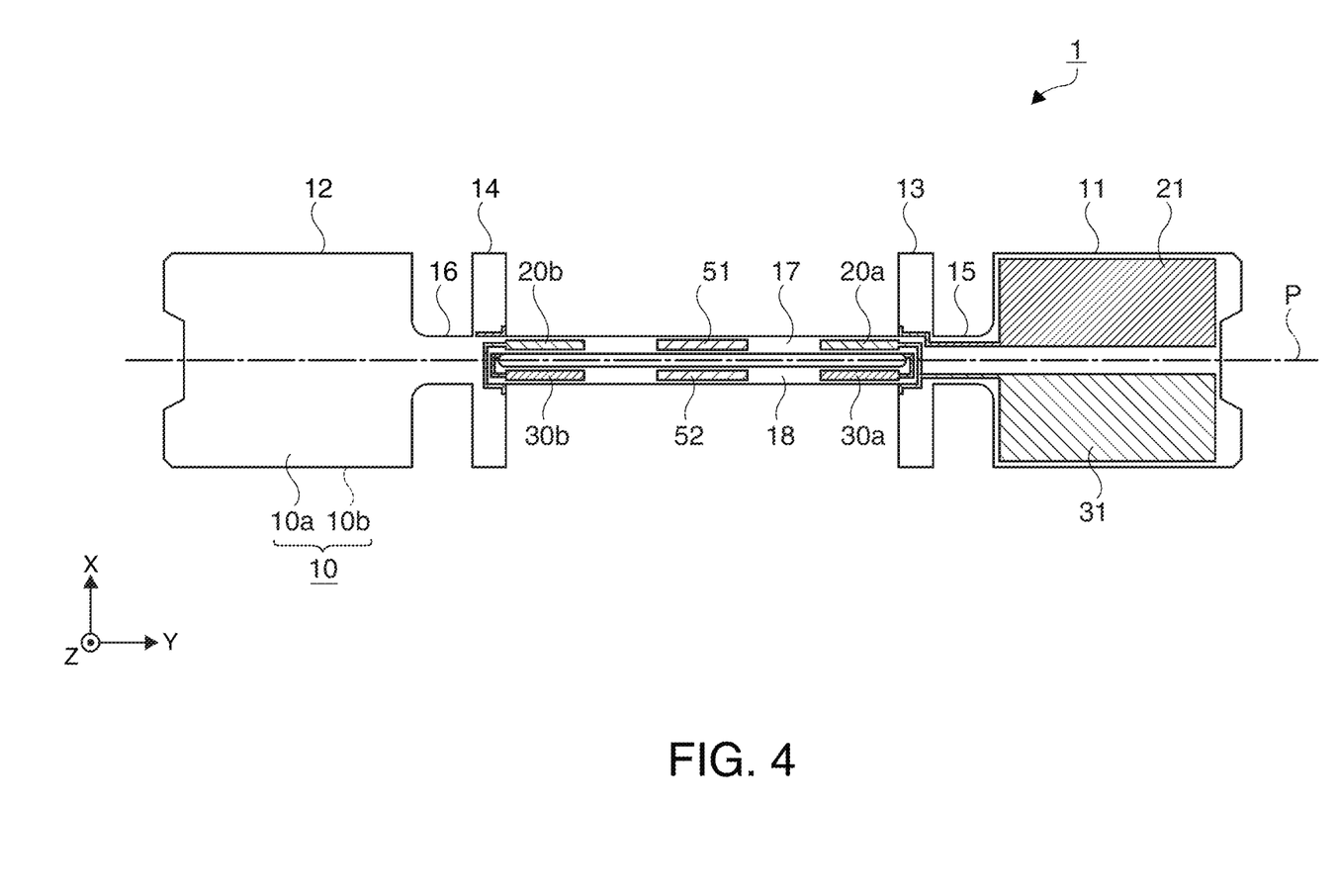
FIG. 4 is a plan view showing an oscillation piece according to a second embodiment.

A second embodiment will subsequently be described. The second embodiment is characterized in that weight films are disposed in central portions of the oscillation arms 17 and 18. A description will therefore be made primarily on differences from the first embodiment (see FIG. 3) and portions common to those in the first embodiment have the same reference characters in the following description.

FIG. 4 is a plan view showing the oscillation piece 1 according to the second embodiment. The drive electrode 20a and the drive electrode 20b are disposed on the first principal surface 10a of the first oscillation arm 17 in a root portion close to the first base 13 and a root portion close to the second base 14, respectively, as shown in FIG. 4.

On the other hand, the drive electrode 30a and the drive electrode 30b are disposed on the first principal surface 10a of the second oscillation arm 18 in a root portion close to the first base 13 and a root portion close to the second base 14, respectively. That is, the drive electrodes 20a, 20b, 30a, and 30b are disposed in the S3 regions (regions where the amount of distortion is large) shown in FIG. 2.

The drive electrodes 20a and 20b are connected to each other with a lead electrode (not shown) and connected to the connection electrode 31 provided on the first principal surface 10a of the first support 11.

Similarly, the drive electrodes 30a and 30b are connected to each other with a lead electrode (not shown) and connected to the connection electrode 21 provided on the first principal surface 10a of the first support 11.

Therefore, when a drive signal is inputted to the drive electrodes, the drive electrodes 20a and 20b and the connection electrode 31 have the same potential, and the drive electrodes 30a and 30b and the connection electrode 21 have the same potential.

Each of the drive electrodes 20a, 20b, 30a, and 30b and the connection electrodes 21 and 31 is formed of a Cr foundation layer on which Au is layered.

The exterior shape of the oscillation piece 1 is symmetrical with respect to the axis P. The drive electrode 20a and the drive electrode 30a are disposed substantially symmetrical with each other with respect to the axis P, and so are the drive electrode 20b and the drive electrode 30b.

The connection electrodes 21 and 31 are connected to a drive circuit (not shown). When an excitation signal is inputted to the connection electrodes 21 and 31, the first oscillation arm 17 and the second oscillation arm 18 make bending oscillation in the ±X direction, as shown in FIG. 2. The drive electrodes 20a, 20b, 30a, and 30b also function as detection electrodes.

Weight films 51 and 52 are disposed on the first oscillation arm 17 and the second oscillation arm 18 in central portions thereof in the longitudinal direction (Y direction). The weight films 51 and 52 are disposed in regions where the amount of produced distortion is small but larger than that in a position close to the root portions of the oscillation arms (S2 regions), as shown in FIG. 2.

The weight films 51 and 52 are disposed symmetrically with respect to the axis P.

Each of the weight films 51 and 52 is formed of a metal film that is formed of a Cr foundation layer on which Au is layered, as each of the drive electrodes is. The material of the weight films 51 and 52 is, however, not limited to Au—Cr.

Further, the weight films 51 and 52 overlap with none of the drive electrodes 20a, 20b, 30a, and 30, but they are disposed independently of each other and separated from the drive electrodes. That is, the weight films 51 and 52 are electrically isolated from the drive electrodes.

In the present embodiment, the weight films 51 and 52 are disposed on the first oscillation arm 17 and the second oscillation arm 18, respectively, in the central portions thereof in the longitudinal direction (S2 regions). The central portion of each of the first oscillation arm 17 and the second oscillation arm 18 is a portion where the amount of distortion is small but larger than that in the root portion and hence a location where frequency adjustment of the double-ended tuning fork oscillation piece is effectively made. Therefore, when the weight films 51 and 52 are disposed in the central portions of the first oscillation arm 17 and the second oscillation arm 18, the frequency adjustment can be effectively made with an effect of the added weight films 51 and 52 on the amount of produced charge suppressed.

Third Embodiment

An oscillator 2 using the oscillation piece 1 described in the first or second embodiment described above will subsequently be described.

Figure 5A:
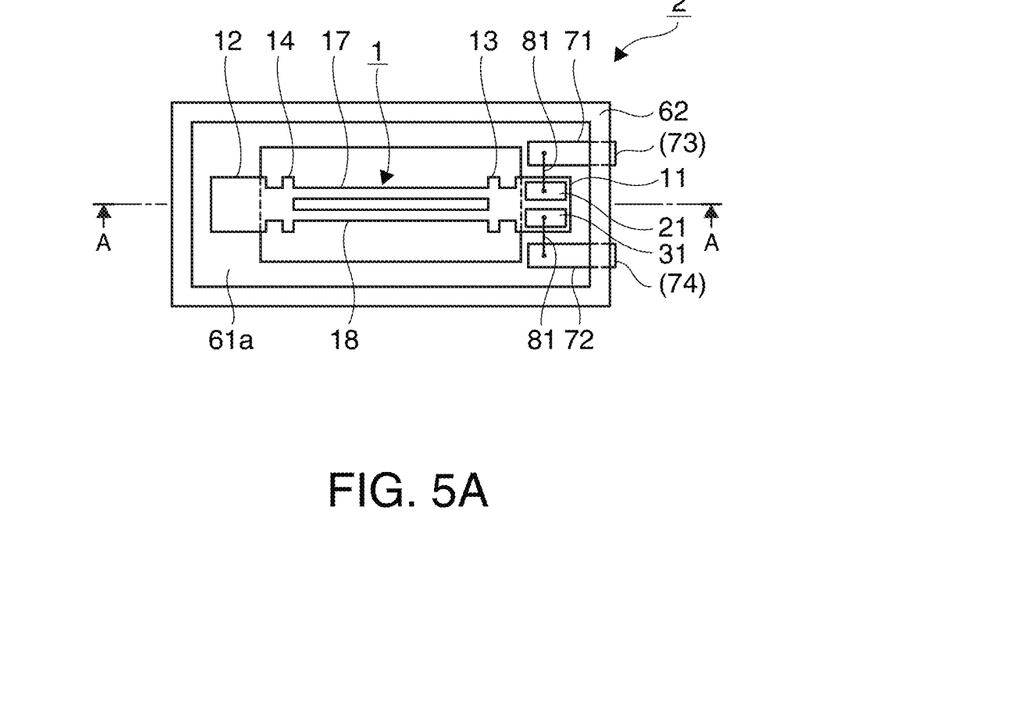
FIG. 5A is a plan view showing the interior of the oscillator.
Figure 5B:
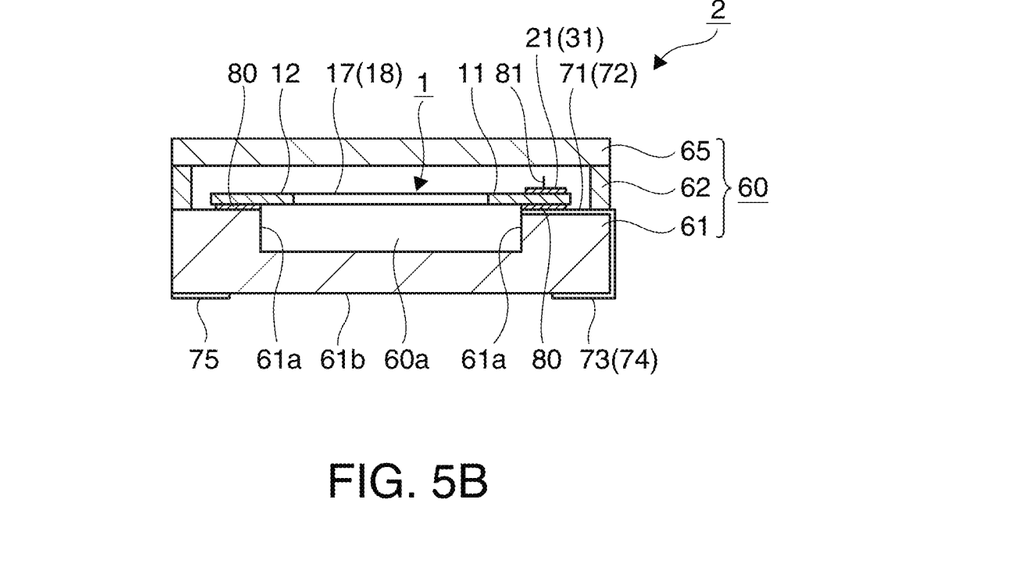
FIG. 5B is a cross-sectional view showing the oscillator taken along an A-A cutting plane.

FIGS. 5A and 5B show an example of the oscillator 2. FIG. 5A is a plan view showing the interior of the oscillator 2, and FIG. 5B is a cross-sectional view showing the oscillator 2 taken along an A-A cutting plane. In FIGS. 5A and 5B, the oscillator 2 is formed of the oscillation piece 1 described above and a package 60, which accommodates the oscillation piece 1.

The package 60 is formed of a package base 61, a package frame 62, which is so disposed that it is layered on the periphery of the package base 61, and a lid 65, which seals an opening of a space formed by the package base 61 and the package frame 62.

Each of the package base 61 and the package frame 62 is formed by stacking a plurality of ceramic green sheets and baking the stacked structure.

The package base 61 has a step 61a formed along the inner surface thereof, and the first support 11 and the second support 12 of the oscillation piece 1 are fixed to the upper surface of the step 61a with an adhesive 80 or any other bonding member in such a way that the first support 11 and the second support 12 form part of a bridge. The first oscillation arm 17 and the second oscillation arm 18 are therefore free to oscillate.

The connection electrodes 21 and 31 (see FIGS. 3 and 4) are provided on the first support 11 of the oscillation piece 1, as shown in FIG. 5A. On the other hand, externally drawing electrodes 71 and 72 are provided on the upper surface of the step 61a of the package base 61. The connection electrode 21 and the externally drawing electrode 71 are connected to each other with a metal wire 81, and the connection electrode 31 and the externally drawing electrode 72 are connected to each other with another metal wire 81.

The externally drawing electrode 71 extends to an external connection electrode 73 on an outer bottom surface 61b of the package base 61 via a side surface electrode provided on an outer side surface of the package base 61. The externally drawing electrode 72 extends to an external connection electrode 74 on the outer bottom surface 61b of the package base 61 via a side surface electrode provided on the outer side surface of the package base 61.

An external connection terminal 75 is provided on the outer bottom surface 61b of the package base 61 in a position separate from the external connection electrodes 73 and 74.

The lid 65 hermetically seals the opening with the oscillation piece 1 fixed to the package base 61. An internal space 60a in the package 60 is preferably depressurized to a state close to a vacuum.

The oscillator 2 described above is so configured that the package 60 accommodates the oscillation piece 1 according to the first or second embodiment. Using the oscillation piece 1, the frequency of which can be precisely adjusted, therefore provides the oscillator 2 with the advantageous effects according to the first or second embodiment.

Further, accommodating the oscillation piece in the package prevents outside moisture and dust from entering and allows precise oscillation to be maintained.

Fourth Embodiment

An electronic device using the oscillation piece 1 according to the first or second embodiment described above will subsequently be described. An electronic device using the oscillation piece 1 can be used as a detector that detects pressure, force (load), acceleration, or any other physical quantity, and the following description will be made with reference to a pressure detection device by way of example.

Figure 6A:
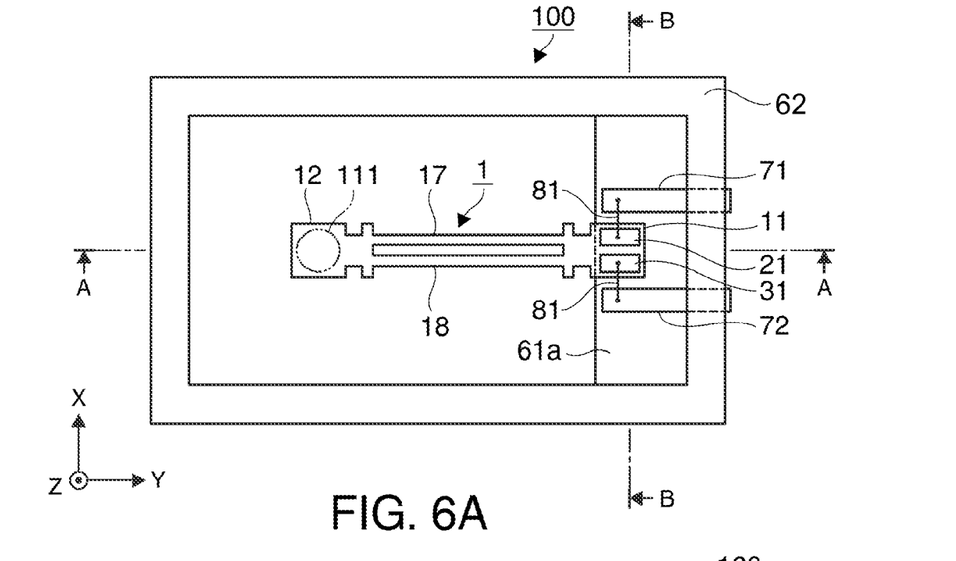
FIG. 6A is a see-through plan view showing the interior of the pressure detection device.
Figure 6B:
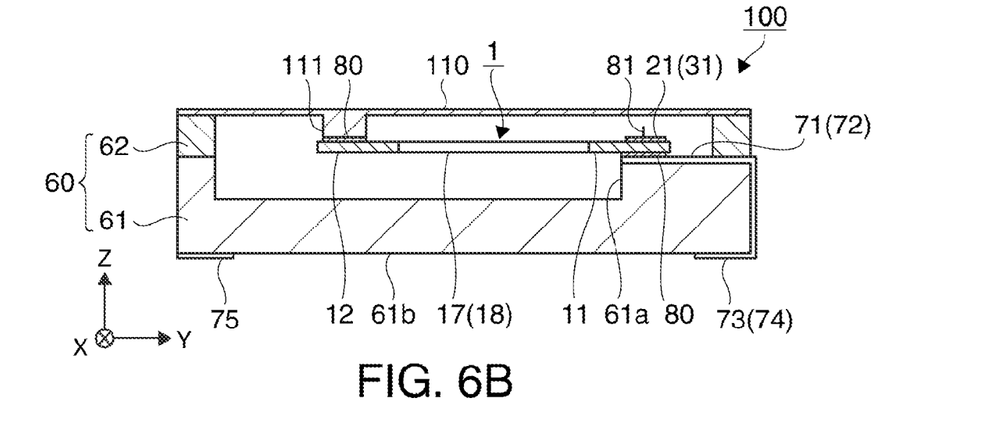
FIG. 6B is a cross-sectional view of the pressure detection device taken along an A-A cutting plane.
Figure 6C:
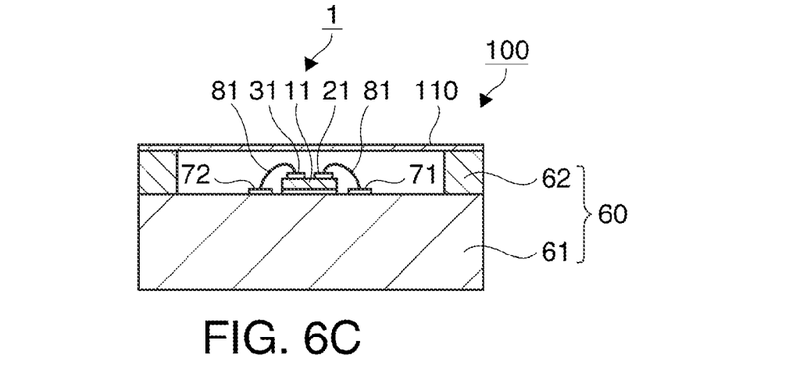
FIG. 6C is a cross-sectional view of the pressure detection device taken along a B-B cutting plane.

FIGS. 6A to 6C show a pressure detection device 100. FIG. 6A is a see-through plan view showing the interior of the pressure detection device 100. FIG. 6B is a cross-sectional view of the pressure detection device 100 taken along an A-A cutting plane. FIG. 6C is a cross-sectional view of the pressure detection device 100 taken along a B-B cutting plane. In FIGS. 6A, 6B, and 6C, the pressure detection device 100 as an electronic device is formed of the oscillation piece 1 according to the first or second embodiment and the package 60, which accommodates the oscillation piece 1.

The package 60 is formed of the package base 61, the package frame 62, which is so disposed that it is layered on the periphery of the package base 61, and an elastic lid 110, which seals an opening of a space formed by the package base 61 and the package frame 62.

Each of the package base 61 and the package frame 62 is formed by stacking a plurality of ceramic green sheets and baking the stacked structure.

The package base 61 has the step 61a formed therein, and the first support 11 of the oscillation piece 1 is fixed to the upper surface of the step 61a with the adhesive 80 or any other bonding member. As a result, the first support 11 is a fixed end, and the second support 12 is a free end. That is, the oscillation piece 1 is so supported by the first support 11 that the oscillation piece 1 behaves as a cantilever.

The connection electrodes 21 and 31 (see FIGS. 3 and 4) are provided on the first support 11 of the oscillation piece 1. On the other hand, the externally drawing electrodes 71 and 72 are provided on the upper surface of the step 61a of the package base 61. The connection electrode 21 and the externally drawing electrode 71 are connected to each other with the metal wire 81, and the connection electrode 31 and the externally drawing electrode 72 are connected to each other with the another metal wire 81.

The externally drawing electrode 71 extends to the external connection electrode 73 on the outer bottom surface 61b of the package base 61 via a side surface electrode provided on an outer side surface of the package base 61. The externally drawing electrode 72 extends to the external connection electrode 74 on the outer bottom surface 61b of the package base 61 via a side surface electrode provided on the outer side surface of the package base 61.

The external connection terminal 75 is provided on the outer bottom surface 61b of the package base 61 in a position separate from the external connection electrodes 73 and 74.

The second support 12 is in contact with a transmission portion 111, which protrudes from the lid 110 toward the oscillation piece 1. The second support 12 and the transmission portion 111 may be fixed to each other, for example, with the adhesive 80.

The lid 110 is formed, for example, of a thin plate made, for example, of SUS and has flexibility in the thickness direction. The lid 110 in the present embodiment can thus serve as what is called a diaphragm.

The first oscillation arm 17 and the second oscillation arm 18 of the oscillation piece 1 oscillate (resonate) at a predetermined frequency in response to a drive signal applied to the drive electrodes 20a and 20b and the drive electrodes 30a and 30b via the connection electrodes 21 and 31.

When a pressure is externally applied, the lid 110 is displaced in the −Z direction, and the displacement of the lid 110 is transmitted to the oscillation piece 1 via the transmission portion 111 and displaces the free end of the oscillation piece 1 in the −Z direction. When the oscillation piece 1 is displaced, the resonant frequency thereof changes. The change in the resonant frequency can be converted into and detected as a pressure. When the internal space 60a in the package 60 has a state close to a vacuum, an absolute pressure can be detected, whereas when the internal space 60a has the atmospheric pressure, a relative pressure can be detected.

The pressure detection device 100 according to the present embodiment, in which the frequency of the oscillation piece 1 is precisely adjusted, is capable of precise pressure detection.

The electronic device is not limited to the pressure detection device 100 but can also be used as a force detection (load detection) device or an acceleration detection device. A force detection (load detection) device may be so configured that a force (load) is applied to the transmission portion, and an acceleration detection device so configured that the transmission portion 111 of the lid 110 is removed and hence the second support 12 operates as a free end can detect acceleration in the Z direction.

Fifth Embodiment

An electronic apparatus using the oscillation piece 1 according to the first or second embodiment described above will subsequently be described. An electronic apparatus in which a pressure detection device as an electronic device using the oscillation piece 1 is incorporated will be described below by way of example.

Figure 7:
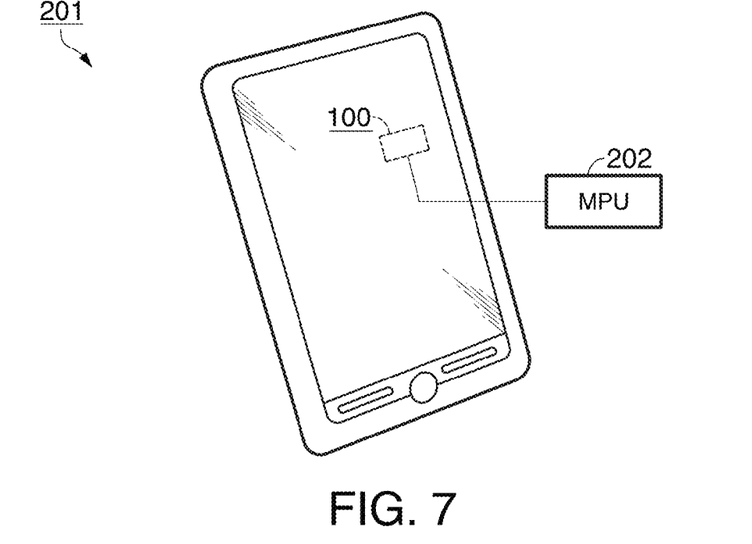
FIG. 7 is a perspective view schematically showing a smartphone as an electronic apparatus.

FIG. 7 is a perspective view schematically showing a smartphone 201 as the electronic apparatus. The pressure detection device 100 is incorporated in the smartphone 201. The pressure detection device 100 used in the smartphone 201 measures barometric pressure or altitude based on the barometric pressure, and a detection signal from the pressure detection device 100 is supplied, for example, to a microcomputer chip (MPU) 202. The MPU 202 can convert the detection signal in a computing process into a barometric pressure or altitude and display the resultant measurement.

Figure 8:
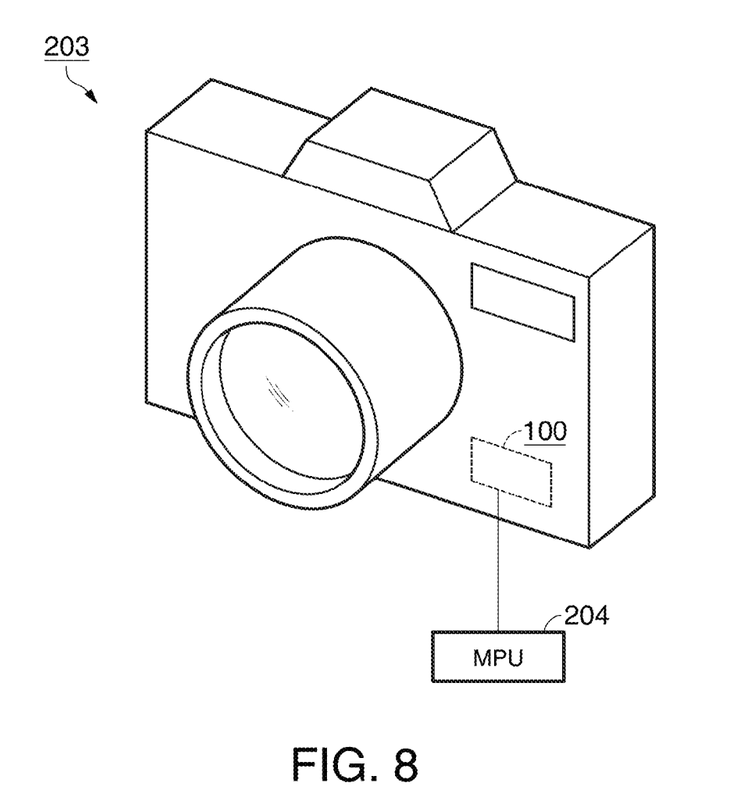
FIG. 8 is a perspective view schematically showing a digital still camera as another specific example of the electronic apparatus.

FIG. 8 is a perspective view schematically showing a digital still camera (hereinafter referred to as "camera") 203 as another specific example of the electronic apparatus. The pressure detection device 100 is incorporated in the camera 203. The pressure detection device 100 used in the camera 203 measures barometric pressure or altitude based on the barometric pressure, and a detection signal from the pressure detection device 100 is supplied, for example, to a microcomputer chip (MPU) 204. The MPU 204 can convert the detection signal in a computing process into a barometric pressure or altitude and display the resultant measurement.

When the camera 203 is an underwater camera capable of underwater imaging, the camera 203 can be converted into a camera capable of water pressure measurement and water depth measurement based on the water pressure is achieved by allowing the pressure detection device 100 to support a water pressure measurement range.

A mobile electronic apparatus in which the pressure detection device 100 described above is incorporated, such as the smartphone 201 and the camera 203 described above by way of example, is capable of measuring accurate barometric pressure, altitude, water pressure, and water depth at a location where a user carries the mobile electronic apparatus, providing the user with convenience in an outdoor usage scene.

Sixth Embodiment

A mobile object using the pressure detection device 100 described above will subsequently be described.

Figure 9:
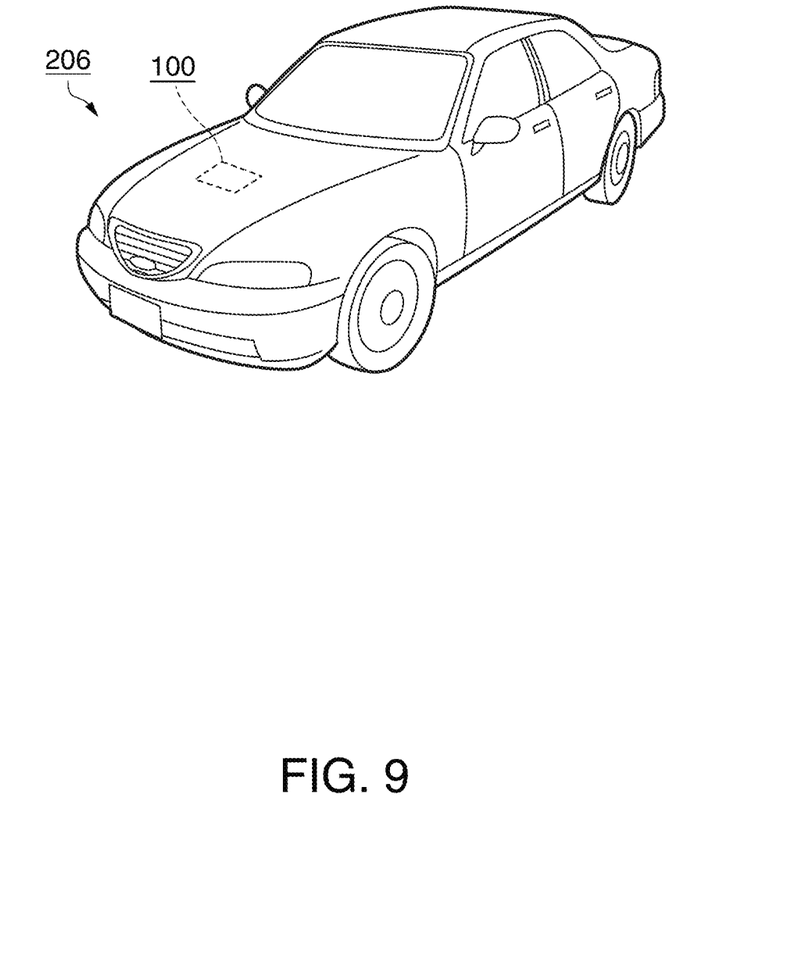
FIG. 9 is a perspective view schematically showing an automobile as a specific example of a mobile object.

FIG. 9 is a perspective view schematically showing an automobile 206 as a specific example of the mobile object. The pressure detection device 100 is incorporated in the automobile 206. The pressure detection device 100 can detect barometric pressure at a location to which the mobile object has moved. For example, the pressure detection device 100 can be used, for example, in a system that automatically changes the mixing ratio between fuel and air when the oxygen concentration decreases due to a change in barometric pressure.

Further, the pressure detection device 100, which has a box-like exterior shape in the above description, can be used in a variety of applications by changing the shape of the package to a cylinder, further increasing the airtightness, and allowing a user to select a desired measurement range as appropriate.

For example, the pressure detection device 100 can be used as a sensor that monitors clogging in a variety of filters, a device that monitors the internal pressure in a compressor in a car air conditioner to feed back the result to an engine controller, a device that controls the oil pressure in a transmission mechanism, and a device that monitors the pressure in an oil pressure unit of a brake.

The entire disclosure of Japanese Patent Application No. 2012-154354, filed Jul. 10, 2012 is expressly incorporated by reference herein.

What is claimed is:

1. An oscillation piece comprising:
a first oscillation arm and a second oscillation arm each of which is provided with a plurality of drive electrodes;
a first base that connects ends of the first oscillation arm and the second oscillation arm on one side to each other and a second base that connects ends of the first oscillation arm and the second oscillation arm on the other side to each other; and
a plurality of weight films provided on each of the first oscillation arm and the second oscillation arm, wherein
the plurality of drive electrodes are provided on end areas of the first and second oscillation arms directly adjacent to the first and second bases and center areas of the first and second oscillation arms between the first and second bases, and
the plurality of weight films are provided on intermediate areas of the first and second oscillation arms between the plurality of drive electrodes.

2. The oscillation piece according to claim 1,
wherein each of the plurality of weight films is a metal film, and
the plurality of drive electrodes and the plurality of weight films are located in positions independent of each other.

3. The oscillation piece according to claim 1,
wherein the plurality of weight films are made of the same material as the plurality of drive electrodes.

4. An oscillator comprising:
the oscillation piece according to claim 1; and
a package that accommodates the oscillation piece.

5. An electronic device comprising:
the oscillation piece according to claim 1; and
a package that accommodates the oscillation piece.

6. The electronic device according to claim 5,
wherein the package includes a package base to which the first base of the oscillation piece is fixed so that the second base is located in an inner space of the package and shifted from the package base in a plan view,
a flexible lid that seals an opening of the package base, and
a transmission portion that transmits a displacement of the lid to the second base of the oscillation piece.

7. An electronic apparatus comprising the oscillation piece according to claim 1.

8. A mobile object comprising the oscillation piece according to claim 1.

* * * * *